United States Patent
Hillman et al.

[11] Patent Number: 6,037,252
[45] Date of Patent: Mar. 14, 2000

[54] METHOD OF TITANIUM NITRIDE CONTACT PLUG FORMATION

[75] Inventors: Joseph T. Hillman, Scottsdale; Michael S. Ameen, Phoenix; Robert F. Foster, Mesa, all of Ariz.

[73] Assignee: Tokyo Electron Limited, Tokyo, Japan

[21] Appl. No.: 08/964,532

[22] Filed: Nov. 5, 1997

[51] Int. Cl.[7] .............................................. H01L 21/4763
[52] U.S. Cl. ...................... 438/637; 438/643; 438/648; 438/652; 438/653; 438/656; 438/668; 438/672; 438/675; 438/680; 438/685
[58] Field of Search .................................. 438/642, 643, 438/648, 652, 653, 656, 666, 668, 672, 675, 680, 685, 637, 638, 640

[56] References Cited

U.S. PATENT DOCUMENTS

| | | | |
|---|---|---|---|
| 5,502,008 | 3/1996 | Hayakawa et al. | 437/225 |
| 5,567,243 | 10/1996 | Foster et al. | 118/730 |
| 5,573,978 | 11/1996 | Cho | 438/653 |
| 5,610,106 | 3/1997 | Foster et al. | 437/245 |
| 5,628,829 | 5/1997 | Foster et al. | 118/723 |
| 5,654,233 | 8/1997 | Yu | 438/643 |
| 5,665,640 | 9/1997 | Foster et al. | 438/680 |
| 5,716,870 | 2/1998 | Foster et al. | 437/192 |
| 5,747,116 | 5/1998 | Sharan et al. | 427/534 |
| 5,863,835 | 1/1999 | Yoo et al. | 438/666 |

FOREIGN PATENT DOCUMENTS

| | | | |
|---|---|---|---|
| 0 478 233 A2 | 9/1991 | European Pat. Off. | H05K 3/00 |
| 06283605 | 10/1994 | European Pat. Off. | H01L 21/90 |
| 0 730 297 A1 | 9/1996 | European Pat. Off. | H01L 23/522 |
| 2 306 777 | 10/1996 | United Kingdom | H01L 23/532 |

OTHER PUBLICATIONS

Mey, Y. J. et al., *Characterization of TiN film grown by low–pressure–chemical–vapor–deposition*, Thin Solid Films 308–309, pp. 594–598 (1997).

Sherman, A. et al., *Step Coverage of Thick, Low Temperature, LPCVD Titantic Nitride Films*, 1046b Extended Abstracts, 90/2, 90, pp. 826–827, XP000165062 (1990).

*Primary Examiner*—John F. Niebling
*Assistant Examiner*—Lynne A. Gurley
*Attorney, Agent, or Firm*—Wood, Herron & Evans, L.L.P.

[57] ABSTRACT

A method of filling a via less than about 0.16 $\mu$m in diameter in an oxide layer of a substrate with a TiN plug deposited by CVD and capping the plug with TiN only. In one embodiment, a first layer of TiN is deposited on a substrate by thermal CVD, and a second layer of TiN is deposited on the first layer by PECVD. Alternatively, a one-step process is used to deposit a TiN layer using either thermal CVD or PECVD. The method eliminates a tungsten layer, and thus eliminates a processing step.

7 Claims, 2 Drawing Sheets

METHOD OF TITANIUM NITRIDE CONTACT PLUG FORMATION

FIELD OF THE INVENTION

This invention relates to the formation of integrated circuits, and specifically to a method of manufacturing smaller metal interconnections in a circuit.

BACKGROUND OF THE INVENTION

Integrated circuits provide the pathways for signal transport in an electrical device. An integrated circuit (IC) in a semiconductor substrate is composed of a number of active transistors contained in a silicon base layer. Overlying the silicon base layer is a metal oxide layer that is formed by reaction of a metal with oxygen. The metal typically is titanium, aluminum, or copper.

To increase the capacity of an integrated circuit, large numbers of interconnections with metal "wires" are made between one active transistor in the silicon base of the substrate and another active transistor in the silicon base of the substrate. The interconnections, collectively known as the metal interconnection of a circuit, are made through holes or vias that are cut into the metal oxide layer. The particular piece of the metal interconnection which actually makes contact with the silicon base is known as the contact. The remainder of the hole or via that has been cut in the metal oxide layer is filled with a conductive material, termed a contact plug.

Vias greater than about 0.16 $\mu$m in diameter are typically filled by first depositing a layer of titanium (Ti) of about 100 Å by plasma enhanced chemical vapor deposition (PECVD) on the silicon base layer. The Ti layer enhances the electrical contact between the silicon layer and the metal oxide layer.

On top of this Ti layer, a titanium nitride (TiN) barrier layer of about 500 Å is next deposited by CVD, preferably by low pressure chemical vapor deposition (LPCVD). Although there are alternative methods of forming a TiN barrier layer, LPCVD is preferred. This is because only LPCVD provides the conformality, defined as the ability to exactly reproduce the surface topography of the underlying substrate, necessary to cover the bottoms and sidewalls of submicron structures with high aspect ratios. The TiN layer serves as a diffusion barrier to keep the metal in the metal oxide layer from diffusing into the silicon layer at the contact. While TiN provides an excellent contact barrier, the TiN must have a thickness of about 500 Å to be effective as a barrier. If the TiN thickness is less than about 500 Å, the metal diffuses into the silicon.

Depending upon the size of the via, a layer of tungsten may also be deposited by CVD. The TiN layer acts as a necessary adhesive for the tungsten layer since tungsten does not adhere to metal oxides. While the absolute thickness of the tungsten layer may vary according to the size of the via to be filled, its relative thickness is about 80% of the via diameter. The tungsten layer provides an area of low resistance, which is important for current conduction in an IC.

The surface of the contact plug is then etched or polished. The resulting planarized surface is necessary for optimal metal interconnections, and thus for optimal function of the IC.

As transistor densities continue to increase, the diameter of the contact plug must decrease to allow for the increased number of interconnections. For vias with a diameter of less than about 0.16 $\mu$m, however, the resistance of the contact plug metallization layer is dominated by the TiN diffusion barrier layer. Since the TiN barrier layer must remain at about 500 Å for robust performance as a diffusion barrier, it follows that the portion of the contact plug that is filled with tungsten is diminished. Subsequent filling of the contact plugs with tungsten, then, provides an extra procedural step with no significant effect on the overall resistance of the contact plug. Accordingly, a process step in the formation of an IC could be eliminated, and manufacturing efficiency could be increased, if a via could be filled with a contact plug of TiN, rather than with TiN and tungsten. Therefore, a method of forming a TiN contact plug by CVD and eliminating a tungsten layer in the contact plug in the formation of an integrated circuit is needed.

TiN films deposited by CVD, however, have relatively high stress. A film with high stress, measured in force per unit area, has a high intensity of internally distributed forces or components of forces that resist a change in volume or shape of the film when the film is subjected to external forces. The high stress limits the maximum film thickness that can be deposited. Typically, the maximum thickness of a TiN film deposited by CVD over conventional first level oxides is about 800 Å. TiN films that are thicker than about 800 Å begin to crack due to internal stress in the film. The thickness of a film needed to fill a via plug has been determined to be generally about 80% of the diameter of the via plug. The reason for this "80% rule" is that the deposited film must not only fill the volume of the via with a contact plug, but it must also fill the "dimple" above the contact plug. The "dimple," defined as an indentation in the TiN that is formed during filling of the via, is eliminated by depositing more TiN on top of the plug, resulting in a capping layer. Thus, calculation of the maximum contact plug diameter that can be filled with a conventional TiN deposit by CVD is obtained by dividing 800 Å by 80%, resulting in a maximum contact diameter of about 1000 Å or about 0.1 $\mu$m. For contact plugs having a diameter that exceeds about 0.16 $\mu$m, filling with a TiN film deposited by CVD results in incomplete filling of the via, resulting in suboptimal operation of the IC.

Therefore, a method of filling a via which is less than about 0.16 $\mu$m in diameter with a contact plug of TiN deposited by CVD and capping without a tungsten capping layer is needed.

SUMMARY OF THE INVENTION

To this end, and in accordance with the principles of the present invention, a method of filling a via with a contact plug of TiN that has been deposited by CVD and capping the plug without a tungsten capping layer is disclosed.

The present invention is also directed to a method of completely filling a via which is less than about 0.16 $\mu$m in diameter with a TiN layer deposited by CVD.

Specifically, this invention is directed to a method of forming a contact plug in a via of an integrated circuit by CVD of a TiN layer and capping the plug without deposition of a tungsten layer. This invention is also directed to a method of filling a via that is less than about 0.16 $\mu$m in diameter with a TiN contact plug.

According to certain aspects of the present invention, the TiN contact plug may be deposited in a two step process, whereby a first TiN layer of about 800 Å is deposited by thermal CVD to fill a via, and a second TiN layer of about 700 Å to about 1200 Å is deposited by PECVD to form a low stress capping layer over the first layer. The TiN contact plug may alternatively be deposited in a single step, whereby a TiN layer of about 1500 Å to about 2000 Å is deposited by either thermal CVD or PECVD.

By virtue of the foregoing, there is thus provided a method of forming a TiN contact plug by CVD and capping the contact plug without a tungsten capping layer, and a method of filling a via that is less than about 0.16 μm in diameter. The TiN film produced by CVD is 100% conformal with the underlying topography. Films that are 100% conformal are beneficial because they exactly reproduce the surface topography of the underlying substrate which allows optimal function of an IC. Thus, this method is useful to completely fill high aspect ratio features. These and other objects and advantages of the present invention shall be made apparent from the accompanying drawings and description thereof.

DETAILED DESCRIPTION OF THE DRAWING

Figure 1:
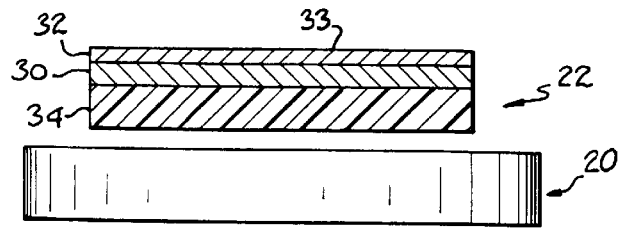
FIG. 1 is a schematic of a susceptor and a substrate.

With reference to FIG. 1, a method of chemical vapor deposition, such as the method described in U.S. Pat. No. 5,628,829 entitled METHOD AND APPARATUS FOR LOW TEMPERATURE DEPOSITION OF CVD AND PECVD FILMS, which is assigned to the Assignee of the present invention and is herein expressly incorporated by reference in its entirety, may be used to deposit TiN. Briefly, and with reference to FIG. 1, a susceptor 20 for a semiconductor substrate 22 supports the substrate 22 for processing. The substrate 22 has a metal oxide layer 30 which is about 1.2 mm thick. The metal may be titanium, aluminum, or copper. On top of the oxide layer 30 is a TiN film 32 having a top surface 33. The oxide layer 30 is supported on a silicon base 34.

Figure 2:
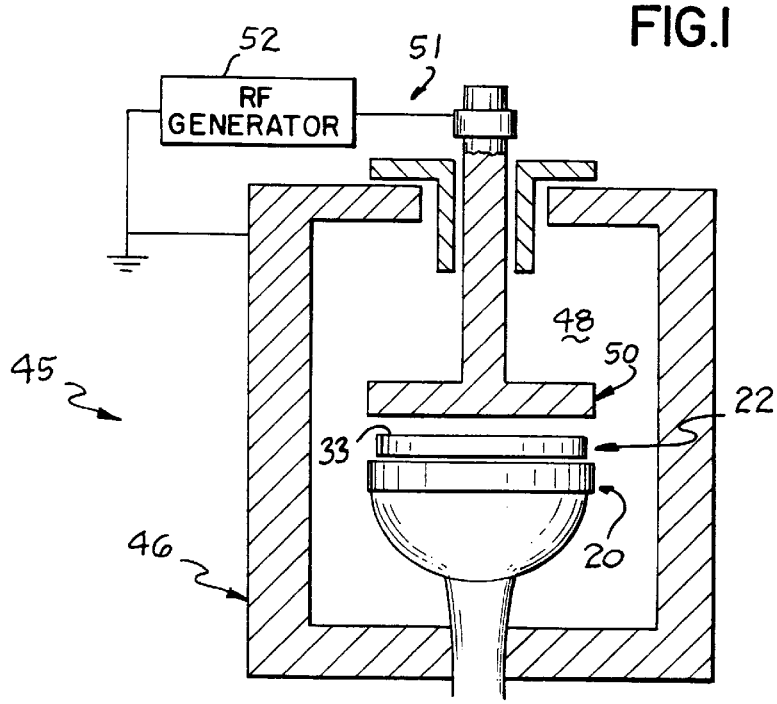
FIG. 2 is a schematic cross-sectional view of a reaction chamber for CVD.

With reference to FIG. 2, a reactor 45 for chemical vapor deposition includes a reaction chamber 46 which encloses a processing space 48. In the reaction chamber 46, which is shown as containing a substrate 22 on the susceptor 20, reactant gases for CVD are delivered to a processing space 48. A gas delivery system, also disclosed in the above-referenced U.S. Pat. No. 5,628,829, provides the proper flow and distribution of the gases for the CVD process. Generally, gas delivery systems contain gas-dispersing elements, such as a flat showerhead 50, in the reaction chamber 46. The showerhead 50 spreads the entering reactant gases around the processing space 48 of the reaction chamber 46 to ensure a uniform distribution and flow of the gases proximate the susceptor 20 and substrate 22. Uniform gas distribution and flow is desirable for a uniform and efficient deposition process, a dense plasma, and a uniformly deposited film. The apparatus 51 to expose the susceptor 20 and substrate 22 to the plasma may be the type described in the above-referenced U.S. Pat. No. 5,628,829. The apparatus 51 preferably includes a radio frequency (RF) generator 52, capable of generating 450 kHz, which is attached to the showerhead 50.

Figure 3:
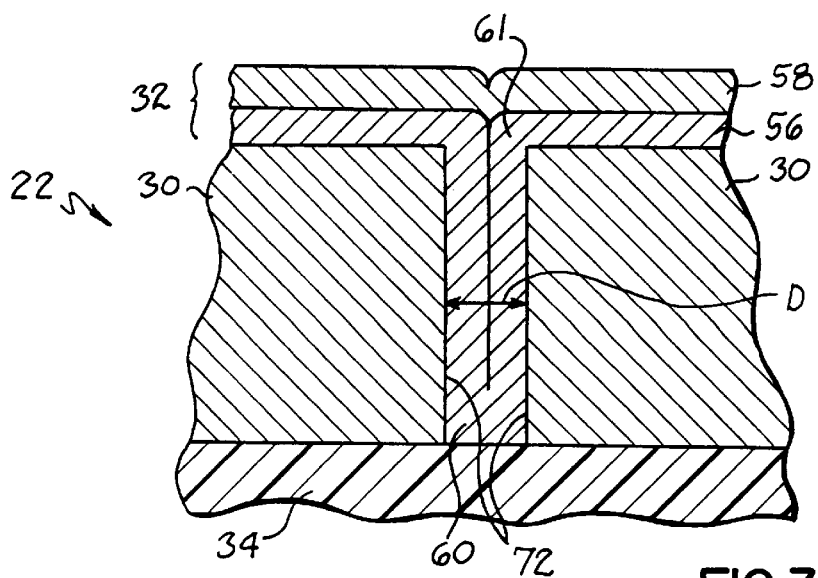
FIG. 3 is a schematic of a contact plug formed by a two step method.

With reference to FIG. 3, the TiN film 32, deposited in a two-step process, is composed of a first TiN layer 56 and a second overlying TiN layer 58. The initial deposit of TiN 56 on the oxide layer 30 is made by thermal CVD and results in a first TiN layer 56 of about 800 Å thick. The initial deposit fills the volume of the via 60, defined by walls 72 of oxide layer 30, with a TiN plug 61 and deposits on the surface of the oxide layer 30. The via 60 to be filled by TiN using the methods of the present invention has a diameter D that is less than about 0.16 μm, and preferably less than about 0.10 μm.

For thermal CVD, the reactant gases are titanium tetrachloride ($TiCl_4$) and ammonia ($NH_3$). Argon (Ar) is used as a carrier gas. The temperature range of the susceptor 20, on which the substrate 22 is supported and in intimate thermal contact therewith, is about 500–700° C., and preferably is around 650° C. The thermally-deposited TiN layer 56 grows conformally with 100% step coverage from the sidewalls 72 of the via 60. Step coverage is defined as the ratio of film thickness on the bottom of a via 60 on a substrate 22 to the run thickness on the sides of the via 60 or top surface of the substrate 22. Thus, the thermally-deposited TiN layer 56 completely fills the less than 0.16 μm in diameter via 60.

After an initial deposit of a first layer of TiN 56 on an oxide layer 30, a second layer of low stress TiN 58 is deposited on the first layer 56. A film that has low stress, measured in force per unit area, has a low intensity of internally distributed forces or components of forces that resist a change in volume or shape of the film when the film is subjected to external forces. The low stress TIN layer 58 has a thickness that is about 80% of the diameter of the via 60. Typically, for vias 60 less than about 0.16 μm, the low stress TiN layer 58 is about 700 Å thick to about 1200 Å thick. This low stress TiN layer 58 is preferably deposited by PECVD.

PECVD may occur by two alternative methods. The first method utilizes the upstream, remote generation of a plasma. The plasma is pumped down to a substrate 22 by a rotating susceptor 20 and is extinguished as it travels to the substrate 22, so that predominantly activated gas radicals are present. The gas radicals combine with unexcited reactant gases to deposit a film layer 58 on the substrate 22 by CVD techniques. The pumping of the rotating susceptor 20 minimizes gas particle recirculations and collisions to yield a useful percentage of radicals. The foregoing PECVD method is disclosed in U.S. Pat. No. 5,567,243 entitled APPARATUS FOR PRODUCING THIN FILMS BY LOW TEMPERATURE PLASMA ENHANCED-CHEMICAL VAPOR DEPOSITION USING A ROTATING SUSCEPTOR REACTOR, which is assigned to the Assignee of the present application and is herein expressly incorporated by reference in its entirety.

The second method, also disclosed in the above-referenced U.S. Pat. No. 5,567,243, utilizes an RF showerhead 50 design which yields a concentrated plasma very close to the substrate surface. All of the gases, both plasma and reactant gases, are passed through the RF showerhead 50 electrode and are excited. Since the susceptor 20 acts as another electrode, the RF showerhead 50 and the susceptor 20 form a parallel plate electrode configuration. With the RF electrode method, the plasma gases utilized in the chemical vapor deposition at the substrate 22 contain a mixture of both ions and radicals which contribute energy to the surface reaction.

More specifically, one CVD process utilizes a plasma source to generate, upstream of a substrate 22, a gas plasma containing various excited particles of the gas, including charged ions and excited, charge-neutral radicals as well as free electrons. The excited particles of the plasma gas, and predominantly the excited radical particles, are brought to the surface before they have had a chance to combine to form neutral molecules. The excited radicals chemically react with one or more reactant gases to form a thin film 32 on a substrate 22. The excited radicals supply energy to the surface reaction such that CVD may be used at temperatures substantially lower than those required with traditional CVD methods.

A reactant gas or gases are introduced into the deposition region above the surface 33 of the substrate 22 to mix with the activated gas radicals. The downward pumping action of the rotating susceptor 20 simultaneously draws the mixture of radicals and reactant gases toward the surface 33 of the substrate 22. At the surface 33, the mixture of radicals and reactant gases flows radially outward from the center of the substrate 22 in a substantially uniform laminar flow pattern and the excited radicals react with the reactant gas particles in a surface reaction which results in a film layer 32 being deposited upon the substrate 22.

The activated radicals supply energy to the surface reaction and thereby reduce the required energy, such as thermal energy, that is necessary for the chemical reaction to take place at the surface of the substrate 22. Therefore, the deposition takes place at a substantially lower temperature than the temperature required by traditional CVD processes. For example, the deposition of a titanium-containing layer using PECVD may be accomplished at 600° C. or below versus 1000° C. for some traditional thermal CVD processes.

The total thickness of the TiN film 32, defined as the sum of the first TiN layer 56 and the second low-stress TiN layer 58, is about 1500 Å to about 2000 Å. The two step process sequence to deposit a TiN film 32 in forming a contact plug 61 can be performed in a single reaction chamber 46 as shown in FIG. 2, using a fixed susceptor 20 temperature of about 650° C.

Figure 4:
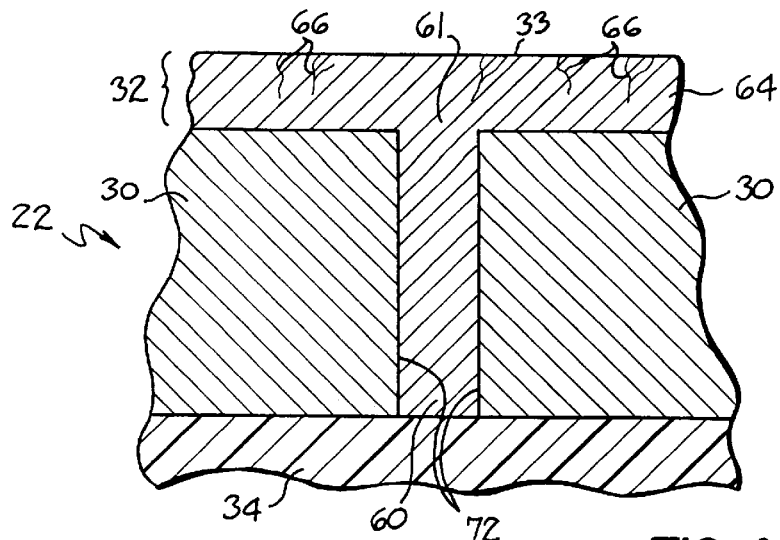
FIG. 4 is a schematic of a contact plug formed by a one step method.

In an alternative embodiment and with reference to FIG. 4, a single step process to form a contact plug 61 is used. A TiN film 32 is composed of a single TiN layer 64 of about 1500 Å to about 2000 Å. The TiN layer 64 is deposited on an oxide layer 30 of a substrate 22 using thermal CVD with a susceptor 20 temperature of about 650° C. The result is a TiN film 32 with 100% conformality, one that adheres well to the oxide layer 30, and one that completely fills the via 60. A drawback of this technique, however, is the presence of microcracks 66. Microcracks 66, appearing at the TiN film 32 surface 33, are defined as discontinuities in the surface material large enough to increase resistance. Microcracks thus result in suboptimal performance of an IC.

Figure 5A:
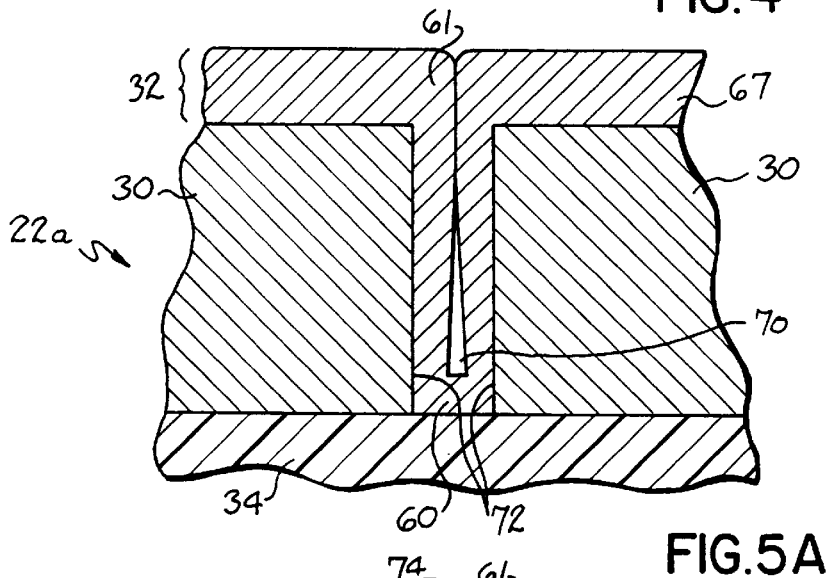
FIGS. 5A and 5B are schematics of contact plugs formed by alternate one step methods.
Figure 5B:
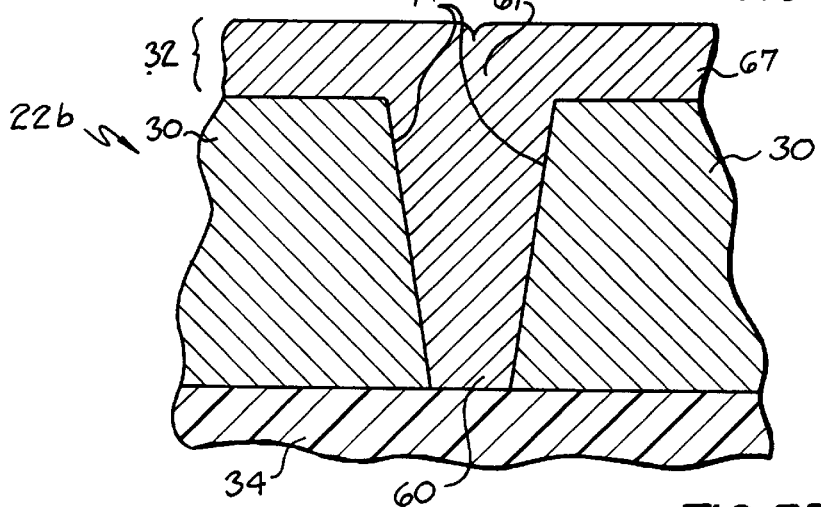

In still other alternative embodiments and with reference to FIGS. 5A and 5B, vias 60 are filled with a contact plug 61 of a TiN film 32 deposited by PECVD in a single layer 67. The resulting TiN film 32 is about 1500 Å to about 2000 Å thick. The film 32 has low stress and, furthermore, is substantially free of the microcracks 66 as seen in FIG. 4. However, the conformality is about 80% when the susceptor 20 temperature for thermal CVD is about 600° C., and the conformality is about 60% when the susceptor 20 temperature for thermal CVD is about 400° C. This is undesirable due to the keyhole 70 effect, whereby the TiN deposited in a via 60 to form a contact plug 61 does not completely fill the via 60 and leaves a "keyhole" 70 that does not contain TiN. The keyhole 70 effect occurs when the via 60 has substantially vertical walls 72, that is, walls that are substantially perpendicular to the base. In a via 60 with sloping walls 74, the keyhole 70 effect is eliminated. While the degree of slope varies with the particular diameter and depth of the via 60, the via 60 can be completely filled and the keyhole 70 effect eliminated with all PECVD reactions by depositing TiN to fill the area calculated by dividing the diameter D of the via 60 at the bottom by the step coverage.

In use, the present invention provides an efficient and effective method of filling a volume of a via 60 that is less than about 0.16 $\mu$m in diameter with a contact plug 61 of TiN only, and capping the contact plug 61 without the need for a tungsten capping layer.

While the present invention has been illustrated by description of embodiments, and while the illustrative embodiments have been described in considerable detail, it is not the intention of the inventors to restrict or in any way limit the scope of the appended claims to such detail. Additional advantages and modifications will readily appear to those skilled in the art. For example, PECVD TiN can be used to complete an incomplete fill of a via 60 with sloped walls 74 with LPCVD TiN. This would allow vias 60 larger than about 0.16 $\mu$m to be filled. The invention in its broader aspects is therefore not limited to the specific details, representative apparatus and methods, and illustrative examples shown and described. Accordingly, departures may be made from such details without departing from the spirit or scope of applicants' general inventive concept.

Having described the invention, what is claimed is:

1. A method of filling a via in an oxide layer of a substrate with a TiN plug and capping, comprising:

depositing a first TiN layer on the oxide layer to form a plug to fill a via, and depositing a second TiN layer on the first TiN layer to cap the first layer.

2. The method of claim 1 comprising depositing the first TiN layer to form a plug in a via having a diameter less than about 0.16 $\mu$m.

3. The method of claim 1 further comprising depositing the first TiN layer by thermal CVD and depositing the second TiN layer by PECVD.

4. The method of claim 1 wherein the first TiN layer deposited is about 800 Å thick and the second TiN layer deposited is about 700 Å to about 1200 Å thick.

5. The method of claim 1 wherein the depositing of the first TiN layer and the depositing of the second TiN layer is performed in a single reaction chamber at a fixed susceptor temperature of about 650° C.

6. A method of filling a via having a diameter less than about 0.16 $\mu$m in an oxide layer of a substrate with a TiN plug, comprising depositing a single TiN layer of about 1500 Å to about 2000 Å to the via and the oxide layer of the substrate by thermal CVD.

7. A method of filling a via having a diameter less than about 0.16 $\mu$m in an oxide layer of a substrate with a TiN plug, comprising depositing a single TIN layer of about 1500 Å to about 2000 Å to the via and the oxide layer of the substrate by PECVD.

* * * * *